US010578967B2

United States Patent
Choi et al.

(10) Patent No.: US 10,578,967 B2
(45) Date of Patent: Mar. 3, 2020

(54) RESIN COMPOSITION, AND DISPLAY DEVICE COMPRISING BLACK BANK MANUFACTURED BY USING SAME

(71) Applicant: LG CHEM, LTD., Seoul (KR)

(72) Inventors: Dongchang Choi, Daejeon (KR); Kyung Soo Choi, Daejeon (KR); Jung Woo Kim, Daejeon (KR); Hae Jung Kim, Daejeon (KR); Guntee Kim, Daejeon (KR)

(73) Assignee: LG CHEM, LTD., Seoul (KR)

(*) Notice: Subject to any disclaimer, the term of this patent is extended or adjusted under 35 U.S.C. 154(b) by 25 days.

(21) Appl. No.: 15/580,572

(22) PCT Filed: Oct. 19, 2016

(86) PCT No.: PCT/KR2016/011722
§ 371 (c)(1),
(2) Date: Dec. 7, 2017

(87) PCT Pub. No.: WO2017/069501
PCT Pub. Date: Apr. 27, 2017

(65) Prior Publication Data
US 2018/0180995 A1   Jun. 28, 2018

(30) Foreign Application Priority Data
Oct. 19, 2015   (KR) .................. 10-2015-0145618

(51) Int. Cl.
| G03F 7/027 | (2006.01) |
| G03F 7/031 | (2006.01) |
| G03F 7/032 | (2006.01) |
| G03F 7/038 | (2006.01) |
| H01L 51/52 | (2006.01) |
| G03F 7/004 | (2006.01) |
| G03F 7/033 | (2006.01) |
| H01L 27/32 | (2006.01) |
| G03F 7/00  | (2006.01) |
| G03F 7/028 | (2006.01) |

(52) U.S. Cl.
CPC ............ *G03F 7/027* (2013.01); *G03F 7/0007* (2013.01); *G03F 7/0045* (2013.01); *G03F 7/028* (2013.01); *G03F 7/031* (2013.01); *G03F 7/033* (2013.01); *G03F 7/038* (2013.01); *H01L 27/3246* (2013.01); *H01L 51/5284* (2013.01)

(58) Field of Classification Search
CPC .......... G03F 7/028; G03F 7/031; G03F 7/032; G03F 7/0007
USPC ...................................... 430/281.1
See application file for complete search history.

(56) References Cited

U.S. PATENT DOCUMENTS

| 8,822,127 | B2* | 9/2014 | Choi ........................ G03F 7/032 430/20 |
| 8,987,410 | B2* | 3/2015 | Jaunky ................... C08G 65/00 528/393 |
| 2002/0022197 | A1 | 2/2002 | Jung et al. |
| 2010/0085518 | A1* | 4/2010 | Choi ..................... G03F 7/0007 349/110 |
| 2012/0189961 | A1* | 7/2012 | Ji ............................ G03F 7/027 430/281.1 |
| 2013/0189623 | A1 | 7/2013 | Kim et al. |
| 2014/0045121 | A1* | 2/2014 | Lee ........................ G03F 7/033 430/280.1 |

FOREIGN PATENT DOCUMENTS

| KR | 10-2001-0112765 A | 12/2001 |
| KR | 10-0994633 B1 | 11/2010 |
| KR | 10-2011-0073254 A | 6/2011 |
| KR | 10-2012-0007453 A | 1/2012 |
| KR | 10-1364229 B1 | 2/2014 |

OTHER PUBLICATIONS

International Search Report and Written Report issued for International Application No. PTC/KR2016/011722 dated Jan. 19, 2017 (10 pages).

* cited by examiner

*Primary Examiner* — John S Chu
(74) *Attorney, Agent, or Firm* — Rothwell, Figg, Ernst & Manbeck, P.C.

(57) ABSTRACT

The present application relates to a negative type photosensitive resin composition including a compound of Chemical Formula 1, an alkali soluble resin binder, a polyfunctional monomer, a colorant, a photoinitiator, and a solvent, and a display apparatus including a black bank formed by using the same.

15 Claims, 1 Drawing Sheet

【FIG. 1】
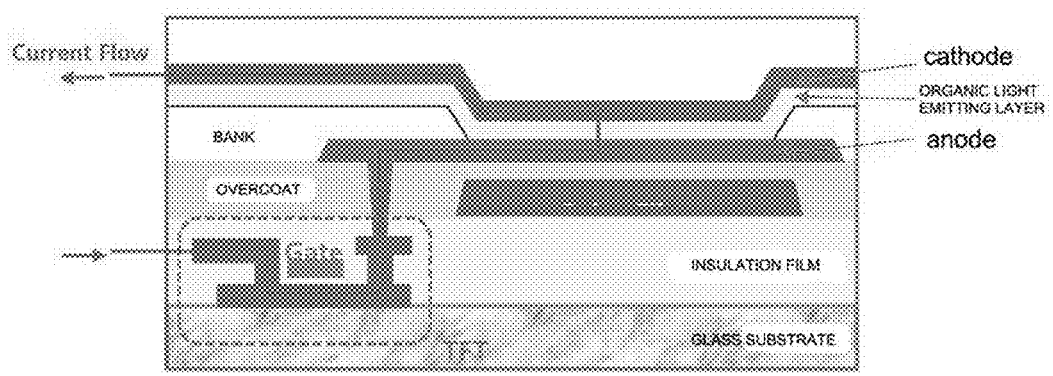
【FIG. 2】
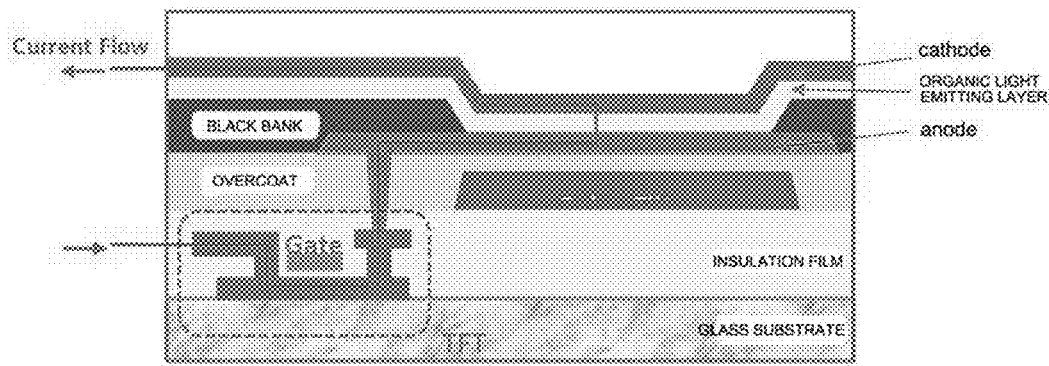
【FIG. 3】
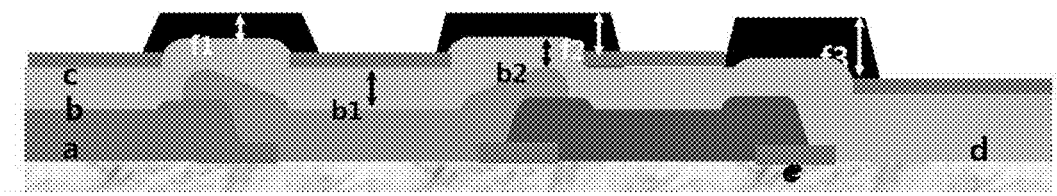

RESIN COMPOSITION, AND DISPLAY DEVICE COMPRISING BLACK BANK MANUFACTURED BY USING SAME

TECHNICAL FIELD

The present invention is a 35 U.S.C. 371 National Phase Entry Application from PCT/KR2016/011722, filed Oct. 19, 2016, which claims priority to and the benefit of Korean Patent Application No. 10-2015-0145618 filed in the Korean Intellectual Property Office on Oct. 19, 2015, the entire contents of which are incorporated herein by reference.

The present application relates to a resin composition and a display apparatus including a black bank prepared by using the same.

BACKGROUND ART

A bank in an organic light emitting device (OLED) serves to specify a shape of a pixel by forming a polyimide insulation layer in every other area except for a region in which an organic light emitting material will be deposited and act as the pixel, and allows each pixel to be electrically independently driven. As a material for forming the bank, a positive type photosensitive polyimide (PSPI) is frequently used.

The existing polyimide-based transparent bank has a limitation in preventing reflection by external light, and defects occurred in terms of image quality, such as occurrence of light leakage due to reflection by metal electrode. Further, when a polarizing plate is used in order to alleviate these problems such as an external light reflection, a transmittance is significantly reduced, and as a result, high voltage driving is required in order to obtain a higher transmittance, and accordingly, there occurs a problem in that the lifetime of the organic light emitting device is shortened for this reason.

Therefore, there is a need for studies on a material for improving visibility by alleviating an external light reflection problem in an organic light emitting device in the art.

DISCLOSURE

Technical Problem

The present application has been made in an effort to provide a resin composition which is suitable for a black bank and capable of improving an external light reflection problem in a display apparatus using an organic light emitting device, and a display apparatus including a black bank prepared by using the same.

Technical Solution

An exemplary embodiment of the present application provides a negative type photosensitive resin composition including a compound of the following Chemical Formula 1, an alkali soluble resin binder, a polyfunctional monomer, a colorant, a photoinitiator, and a solvent.

[Chemical Formula 1]

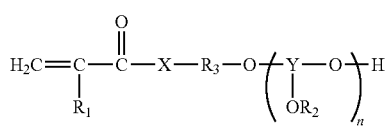

In Chemical Formula 1, $R_1$ is hydrogen; or a linear or branched alkyl group, $R_2$ is $CHR_6CH(OH)CHR_7(OH)$, and here, $R_6$ and $R_7$ are hydrogen; or a linear or branched alkyl group, X is —NH— or —O—, $R_3$ is a linear or branched alkylene; or aralkylene, and Y is a linear or branched alkylene, and n is an integer of 1 to 10.

According to another exemplary embodiment of the present application, the negative type photosensitive resin composition further includes a fluorine-based or silicone-based surfactant.

Still another exemplary embodiment of the present application provides a display apparatus including a black bank formed by using the above-described negative type photosensitive resin composition.

Advantageous Effects

When a black bank is formed and applied by using a resin composition in the exemplary embodiments described in the present specification, an image quality problem occurring from the transparent bank may be effectively improved by blocking an external light reflection and a metal reflection. Further, even when the resin composition is applied to a substrate having a different height, a black bank having a predetermined thickness or more may be formed, and accordingly, a desired optical density (OD) may be uniformly obtained.

DESCRIPTION OF DRAWINGS

FIG. 1 is a schematic view of a display apparatus including a transparent bank in the related art.

FIG. 2 is a schematic view of a display apparatus including a black bank according to an exemplary embodiment of the present application.

FIG. 3 is a schematic view illustrating a thickness of a paint film formed by using a resin composition according to exemplary embodiments of the present application.

REFERENCE NUMERAL a: Color filter
b: Overcoat layer
b1: Thickness of overcoat layer on flat part of pixel of color filter
b2: Thickness of overcoat layer of stacking part of pixels of color filter
c: Metal electrode
d: White pixel
e: Metal line
f1: Thickness of black bank on stacking part and overcoat layer of pixels of color filter
f2: Thickness of black bank on flat part and overcoat layer of pixel of color filter
f3: Thickness of black bank formed on white pixel

MODE FOR DISCLOSURE

An exemplary embodiment of the present application relates to a negative type photosensitive resin composition, which includes the compound of Chemical Formula 1, an alkali soluble resin binder, a polyfunctional monomer, a colorant, a photoinitiator, and a solvent. By adding the compound of Chemical Formula 1, the flowability of the negative type photosensitive resin composition including the colorant may be improved.

Specifically, FIG. 3 exemplifies a structure in which a black bank is formed. As illustrated in FIG. 3, at a lower substrate to which the black bank is applied, a color filter (a), an overcoat layer (b), a metal electrode (c), a metal line (e), and the like are already stacked. According to an example, the metal line (e) may serve as a gate of a thin film transistor (TFT). In this case, when the flow direction of current is observed in the stacking structure of FIG. 2, current is applied through the metal line (e), which is the gate of the thin film transistor (TFT), and then flows to an organic light emitting layer and a negative electrode via the metal electrode (c), which serves as a positive electrode. For example, the color filter, the overcoat layer, and the metal electrode may be usually formed to have a thickness of 2 to 2.5 μm, 1 to 3 μm, and 500 to 2,000 Å, respectively. In FIG. 3, reference numeral b1 is a thickness of an overcoat layer on a flat part of a pixel of a color filter, and reference numeral b2 is a thickness of an overcoat layer of a stacking part of pixels of the color filter.

In particular, recently, a white pixel (d) may be added for the purpose of improving transmittance. In FIG. 3, reference numeral f1 is a thickness of a black bank on a stacking part and an overcoat layer of pixels of the color filter, reference numeral f2 is a thickness of a black bank on a flat part and the overcoat layer of a pixel of the color filter, and reference numeral f3 is a thickness of a black bank formed on a white pixel. The difference between the thickness (f1) of the black bank at a part in which respective color layers meet each other and are stacked and the thickness (f3) of the black bank on the white pixel part filled with the overcoat layer becomes extreme.

Due to the difference in thickness of a stacking structure of the substrate to which the black bank is applied as described above, the surface roughness is significant, and when a paint film is formed by using a resin composition for a black bank, the composition flows down at a color stacking part having a high roughness due to the surface roughness, so that a black bank having a predetermined height is not easily formed. However, in the present invention, the flow characteristics of the resin composition are improved by using the compound of Chemical Formula 1, so that it is possible to form a black bank having a predetermined thickness while a resin composition does not flow down even though a highly rough part on a surface having a significant surface roughness is coated with the resin composition.

According to an exemplary embodiment of the present application, Chemical Formula 1 may be represented by the following Chemical Formula 2.

[Chemical Formula 2]

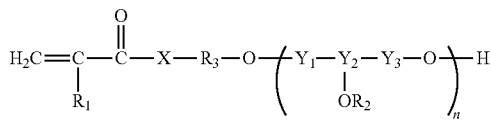

In Chemical Formula 2, $R_1$, $R_2$, $R_3$, X, and n are the same as those defined in Chemical Formula 1, $Y_1$ and $Y_3$ are a direct bond; or a linear or branched alkylene, and $Y_2$ is a linear or branched alkylene.

In the present specification, the alkylene may be an alkylene having 1 to 20 carbon atoms.

According to an example, $R_3$ may be a linear or branched alkylene having 1 to 20 carbon atoms, or an aralkylene having 7 to 20 carbon atoms.

According to another Example, Y may be an alkylene having 1 to 6 carbon atoms.

According to still another Example, $Y_1$ and $Y_3$ are a direct bond; or an alkylene having 1 to 3 carbon atoms, and $Y_2$ is an alkylene having 1 to 3 carbon atoms.

In the present specification, an alkyl group may be an alkyl group having 1 to 20 carbon atoms.

For example, $R_1$ may be a linear or branched alkyl group having 1 to 4 carbon atoms.

As another Example, $R_6$ and $R_7$ are hydrogen; or an alkyl group having 1 to 6 carbon atoms.

In the present specification, an aralkyl group is an alkyl group substituted with an aryl group, and the number of carbon atoms thereof may be 7 to 20. Here, examples of the aryl group include phenyl, naphthyl, and the like.

According to an exemplary embodiment of the present application, Chemical Formula 1 may be represented by the following Chemical Formula 3.

[Chemical Formula 3]

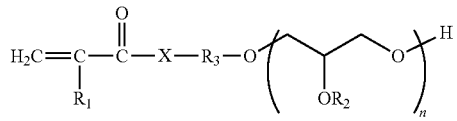

In Chemical Formula 3, the definitions of the substituents are the same as those in Chemical Formula 1.

According to an exemplary embodiment of the present application, Chemical Formula 1 may be represented by the following Chemical Formula 4 or 5.

[Chemical Formula 4]

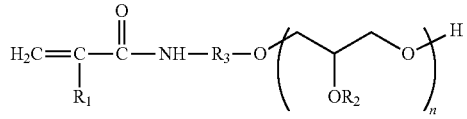

[Chemical Formula 5]

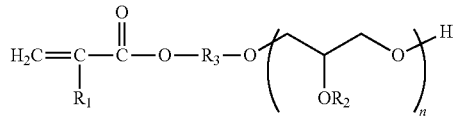

In Chemical Formulae 4 and 5, the definitions of the substituents are the same as those in Chemical Formula 1.

According to another exemplary embodiment of the present application, the compound of Chemical Formula 1 is included in an amount of 100 ppm to 3,000 ppm based on the entire resin composition. When the content is 100 ppm or more, the thickness (f1) of the black bank on the stacking part of the color filter is effectively formed. When the thickness (f1) of the black bank on the stacking part of the color filter is not effectively formed, it may be difficult to secure the optical density (OD). When the content is 3,000 ppm or less, the thickness (f1) of the black bank on the stacking part of the color filter is effectively formed, and it is advantageous in maintaining the process margin. According to an example, the compound of Chemical Formula 1 is included in an amount of 500 ppm to 3,000 ppm based on the entire resin composition.

According to another exemplary embodiment of the present application, the negative type photosensitive resin composition may further include a surfactant. As the surfactant, a fluorine-based or silicone-based surfactant may be used. A negative type photosensitive resin composition in the related art uses the fluorine-based or silicone-based surfactant in an amount of 500 ppm or more. According to exemplary embodiments of the present application, the fluorine-based or silicone-based surfactant may be used in an amount of 50 ppm or more and 450 ppm or less. In this case, even when the roughness of the lower coating substrate is significant, the leveling effects of the surface are controlled, and accordingly, a predetermined thickness or more may be formed on the roughness. When the surfactant is used in an amount of less than 50 ppm, there is almost no surface flattening effect even though the thickness (f1) of the black bank can be formed on the stacking part of the color filter, so that problems may be caused in the subsequent process because surface defects may occur, and beads are formed thick at the edges of the coating substrate. When the surfactant is used in an amount of more than 450 ppm, the flattening effects are so good that it is disadvantageous to form the thickness (f1) of the black bank on the stacking part of the color filter. According to still another exemplary embodiment of the present application, as the alkali soluble resin binder, it is possible to use a copolymer formed by copolymerizing a monomer including an acid functional group and a monomer capable of copolymerizing with the monomer. By the copolymerization as described above, the strength of a film may be increased as compared to a resin prepared by homopolymerization. Otherwise, it is also possible to use a polymer compound prepared by a polymer reaction of the formed copolymer with an ethylenically unsaturated compound containing an epoxy group. Further, it is also possible to together use a polymer compound formed by combining the ethylenically unsaturated compound containing an epoxy group with the copolymer structure.

Non-limiting examples of the monomer including an acid functional group include (meth)acrylic acid, crotonic acid, itaconic acid, maleic acid, fumaric acid, monomethyl maleic acid, isoprene sulfonic acid, styrene sulfonic acid, 5-norbornene-2-carboxylic acid, and the like. These monomers may be used either alone or in mixture of two or more thereof.

Non-limiting examples of the monomer capable of copolymerizing with the monomer including an acid functional group include styrene, chloro styrene, α-methyl styrene, vinyl toluene, 2-ethylhexyl(meth)acrylate, methyl (meth)acrylate, ethyl (meth)acrylate, butyl (meth)acrylate, benzyl (meth)acrylate, dimethylaminoethyl (meth)acrylate, isobutyl (meth)acrylate, t-butyl (meth)acrylate, cyclohexyl (meth)acrylate, dicyclofentanyl (meth)acrylate, isobornyl (meth)acrylate, 2-phenoxyethyl (meth)acrylate, tetrahydrofurfuryl (meth)acrylate, hydroxyethyl (meth)acrylate, 2-hydroxyethyl (meth)acrylate, 2-hydroxypropyl (meth)acrylate, 2-hydroxy-3-chloropropyl (meth)acrylate, 2-hydroxybutyl (meth)acrylate, 4-hydroxybutyl (meth)acrylate, dimethylaminomethyl (meth)acrylate, diethylamino (meth)acrylate, acyloctyloxy-2-hydroxypropyl (meth)acrylate, ethylhexyl acrylate, 2-methoxyethyl (meth)acrylate, 3-methoxybutyl (meth)acrylate, butoxyethyl (meth)acrylate, ethoxydiethyleneglycol (meth)acrylate, methoxytriethyleneglycol (meth)acrylate, methoxytripropyleneglycol (meth)acrylate, methoxypolyethyleneglycol (meth)acrylate, phenoxydiethyleneglycol (meth)acrylate, p-nonylphenoxypolyethyleneglycol (meth)acrylate, p-nonylphenoxypolypropyleneglycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, β-(meth)acyloloxyethylhydrogen succinate, methyl α-hydroxymethyl acrylate, ethyl α-hydroxymethyl acrylate, propyl α-hydroxymethyl acrylate, butyl α-hydroxymethyl acrylate, N-phenylmaleimide, N-(4-chlorophenyl)maleimide, and the like. These monomers may be used either alone or in mixture of two or more thereof.

Further, non-limiting examples of the ethylenically unsaturated compound containing an epoxy group, which is capable of polymerizing with the copolymer of the monomer including an acid functional group with the monomer capable of copolymerizing with the monomer, include glycidyl (meth)acrylate, vinyl benzylglycidyl ether, vinyl glycidyl ether, allylglycidyl ether, 4-methyl-4,5-epoxypentene, γ-glycidoxy propyl trimethoxysilane, γ-glycidoxy propyl methyldiethoxysilane, γ-glycidoxy propyl triethoxy silane, nobornyl derivatives, and the like. These compounds may be used either alone or in mixture of two or more thereof. According to an example, as the alkali soluble resin binder, a copolymer of a diol compound including a fluorene group with a diisocyanate compound may be used.

For example, as the alkali soluble resin binder, a fluorene-based resin polymer of the following Chemical Formula 6 may be used.

[Chemical Formula 6]

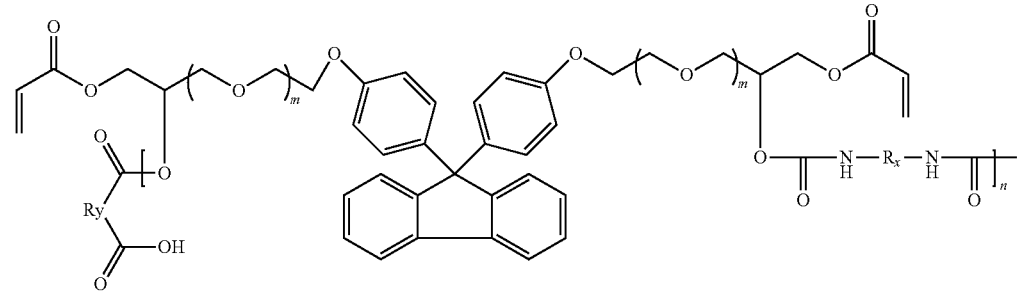

In the formula, Rx is a divalent hydrocarbon group derived from diisocyanate, Ry is a group which constitutes an acid component derived from an acid anhydride, m is 0 to 3, and n is 3 to 8.

As the diol compound including a fluorene group, a compound of the following Chemical Formula 7 may be used.

[Chemical Formula 7]

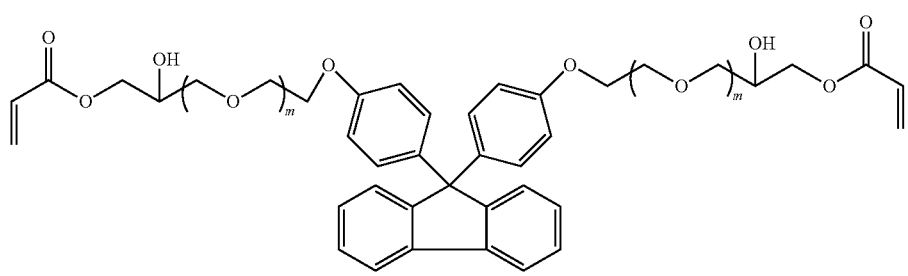

In the formula, m is 0 to 3.

The diisocyanate is not particularly limited as long as the diisocyanate is a compound having two isocyanate groups, and for example, it is possible to use a compound selected from the group consisting of trimethylenediisocyanate, tetramethylenediisocyanate, hexamethylenediisocyanate, pentamethylenediisocyanate, 1,2-propylenediisocyanate, 2,3-butylenediisocyanate, 1,3-butylenediisocyanate, dodecamethylenediisocyanate, 2,4,4-trimethyl hexamethylene diisocyanate, w,w'-diisocyanate-1,3-dimethylbenzene, w,w'-diisocyanate-1,4-dimethylbenzene, w,w'-diisocyanate-1,3-diethylbenzene, 1,4-tetra methyl xylene diisocyanate, 1,3-tetramethyl xylene diisocyanate, isophoronediisocyanate, 1,3-cyclopentanediisocyanate, 1,3-cyclohexanediisocyanate, 1,4-cyclohexanediisocyanate, methyl-2,4-cyclohexanediisocyanate, methyl-2,6-cyclohexane diisocyanate, 4,4'-methylene bisisocyanate methylcyclohexane, 2,5-isocyanatemethyl bicyclo[2,2,2]heptane, and 2,6-isocyanatemethyl bicyclo[2,2,1]heptane.

According to an example, the reaction equivalent ratio of the diol compound including a fluorene group:the diisocyanate may be 1.1:1 to 3:1. As the alkali soluble resin binder, one of the above-described examples may also be used, and two or more thereof may be used together.

The alkali soluble resin binder has an acid value of approximately 30 to 300 KOH mg/g, and preferably a weight average molecular weight in a range of 2,000 to 200,000. More preferably, the weight average molecular weight can be in a range of approximately 5,000 to 40,000. When the molecular weight of the alkali soluble resin binder is within the range, a tapered angle may be prevented from being excessively increased when an insulation film is formed, and the range is advantageous in the development with respect to an aqueous alkaline solution and the prevention of residues. In the case of using a resin binder having the acid value and molecular weight range as described above, when the resin compositions according to the exemplary embodiments described in the present specification are photopolymerized by using a predetermined pattern mask, and then a pattern is formed by the development, the tapered angle of the paint film after the development may have a gentle angle of 35° or less. When the tapered angle of the paint film becomes gentle as described above, the possibility that a short circuit occurs in an electrode becomes very low even though the electrode is formed on the pattern.

The alkali soluble resin binder may be used either alone or in mixture of two or more thereof.

The alkali soluble resin binder may be included in an amount of 1 to 30 wt % based on the total weight of the resin composition. When the content thereof is 1 wt % or more, the content is advantageous in adhesion of the paint film, and when the content thereof is 30 wt % or less, it is possible to prevent the strength and sensitivity of the paint film from deteriorating.

In another exemplary embodiment of the present application, as the polyfunctional monomer, a polyfunctional monomer having an ethylenically unsaturated double bond may be used.

Examples of the polyfunctional monomer having an ethylenically unsaturated double bond include a compound having at least one or two or more addition-polymerizable unsaturated groups in the molecule and a boiling point of 100° C. or more, or a polyfunctional monomer into which caprolactone is introduced, and the like.

Non-limiting examples of the compound having at least one or two or more addition-polymerizable unsaturated groups in the molecule and a boiling point of 100° C. or more include a polyfunctional monomer such as polyethylene glycolmono (meth)acrylate, polypropylene glycolmono (meth)acrylate, or phenoxyethyl (meth)acrylate, a polyfunctional monomer such as polyethylene glycol (meth)acrylate, polypropylene glycol (meth)acrylate, trimethylolethane triacrylate, trimethylolpropane triacrylate, neopentyl glycol (meth)acrylate, pentaerythritol tetraacrylate, pentaerythritol triacrylate, dipentaerythritol pentaacrylate, or dipentaerythritol hexaacrylate, and the like.

Non-limiting examples of the polyfunctional monomer into which caprolactone is introduced include a case where caprolactone is introduced into dipentaerythritol, a case where caprolactone is introduced into tetrahydrofuryl acrylate, a case where caprolactone is introduced into neopentyl glycol hydroxypivalate, a case where caprolactone is introduced into a bisphenol A derivative, a case where caprolactone is introduced into a urethane-based polyfunctional monomer, and the like.

Specific examples thereof include KAYARAD DPCA-20, 30, 60, 120, and the like in which caprolactone is introduced into dipentaerythritol, FA-2D, FA1DT, FA-3, and the like, and it is possible to use KAYARAD TC-110S in which caprolactone is introduced into tetrahydrofuryl acrylate, or KAYARAD HX-220, KAYARAD HK-620, and the like in which caprolactone is introduced into neopentyl glycol hydroxypyvalate.

Other examples thereof include those in which caprolactone is introduced into epoxyacrylate of a bisphenol A derivative or novolac-epoxyacrylate, and those in which caprolactone is introduced into U-324A, U15HA, U-4HA, and the like which are a urethane-based polyfunctional acrylate.

The polyfunctional monomer having an ethylenically unsaturated double bond may be used either alone or in mixture of two or more thereof.

It is preferred that the polyfunctional monomer having an ethylenically unsaturated double bond is included in an amount of 1 to 30 wt % based on the total weight of the resin composition. When the content thereof is 1 wt % or more, the content is advantageous in the photosensitivity or strength of an insulation film, and when the content thereof is 30 wt % or less, it is possible to prevent the tackiness of the paint film from being excessive, and to prevent the strength of the insulation film from deteriorating and the pattern from being lost during the development.

As an Example, as an amount of the alkali soluble resin binder and the polyfunctional monomer having an ethylenically unsaturated double bond used, the weight ratio is preferably 1:0.3 to 1:1, and more preferably, it is possible to adjust the ratio to 1:0.4 to 1:0.8. When the preparation is performed at the aforementioned ratio, when the resin compositions according to the exemplary embodiments described in the present specification are photopolymerized by using a predetermined pattern mask, and then a pattern is formed by the development, the tapered angle of the pattern film after the development may have a gentle angle of 35° or less. When the tapered angle becomes gentle as described above, the possibility that a short circuit occurs in an electrode becomes low even though the electrode is formed on the pattern.

According to an exemplary embodiment of the present application, the colorant includes a black organic pigment. In the present specification, the black organic pigment means a pigment which is composed of organic materials, and absorbs light within a visible light wavelength range as a single species to exhibit a black-based color. As the black pigment, an organic pigment may be used to achieve a desired optical density (OD) in a smaller amount than the existing combination pigment of two or more pigments or inorganic pigment. The compositions according to exemplary embodiments of the present specification may include one or two or more as the black organic pigment.

According to an exemplary embodiment, a lactam-based pigment or a perylene-based pigment may be used as the black organic pigment.

According to an example, the black organic pigment includes a compound represented by the following Chemical Formula 11 or 12.

[Chemical Formula 11]

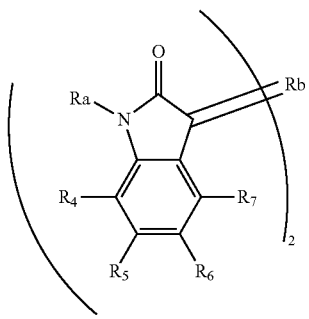

In Chemical Formula 11,
Ra is H or an alkyl group,
$R_4$, $R_5$, $R_6$, and $R_7$ are the same as or different from each other, and are each independently H, halogen, $-COOR_8$, $-CONR_8R_9$, $-OR_8$, $-OOCR_8$, $-OOCNR_8R_9$, OH, CN, $NO_2$, $NR_8R_9$, $-NR_8COR_9$, $-N=CR_8R_9$, $-SR_8$, $-SOR_8$, $-SO_xR_8$ (x=1 to 3) or $-SO_2NR_8R_9$, or $R_4$ and $R_5$, $R_5$ and $R_6$, or $R_6$ and $R_7$ directly combine with each other, or combine with each other via an O, S, or $NR_8$ bridge to form a ring, Rb is a monocyclic or polycyclic group including one of N, O, S, CO, and COO, $R_8$ and $R_9$ are the same as or different from each other, and are each independently H, a $C_1$ to $C_{12}$ alkyl, a $C_3$ to $C_{12}$ cycloalkyl, a $C_2$ to $C_{12}$ alkenyl, a $C_3$ to $C_{12}$ cycloalkenyl, or a $C_2$ to $C_{12}$ alkynyl, at least one of $-CH_2-$, $-CH=$, and $-C$ which constitute the aforementioned groups, is substituted with $-COO-$, $-O-$, $-CONR_{10}$, $=N-$, $-NR_{10}-$, $-S-$, or $-CO-$, or at least one of hydrogens bonded to carbon may be substituted with halogen, $-COOR_{10}$, $-CONR_{10}R_{11}$, $-OR_{10}$, $-OOCR_{10}$, $-OOCNR_{10}R_{11}$, OH, CN, $NO_2$, $-NR_{10}COR_{11}$, $-N=CR_{10}R_{11}$, $SR_{10}$, $-SOR_{10}$, $-SOxR_{10}$ (x=1 to 3), $-SO_2NR_{10}R_{10}$, or $-NR_{10}R_{11}$, and here, $R_{10}$ and $R_{11}$ are each independently a $C_2$ to $C_6$ alkyl, or a group including O, S, or NH.

[Chemical Formula 12]

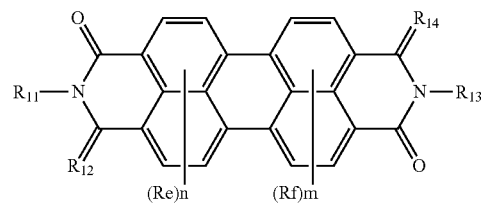

In Chemical Formula 12,
$R_{11}$ and $R_{13}$ are the same as or different from each other, and are each independently H, a $C_1$ to $C_{12}$ alkyl, a $C_3$ to $C_{12}$ cycloalkyl, a $C_6$ to $C_{12}$ aryl group, or a $C_3$ to $C_{12}$ heteroaryl group, at least one of $-CH_2-$ and $-CH=$, which constitute the aforementioned groups is substituted with $=N-$, $-N=N-$, $-O-$, $-CO-$, $-COO-$, or $-NR_{15}-$, at least one of hydrogens bonded to carbon may be substituted with halogen, $-OR_{15}$, CN, or $NO_2$, $R_{15}$ is H, a $C_1$ to $C_6$ alkyl, a $C_2$ to $C_6$ alkenyl, or phenyl, $R_{12}$ and $R_{14}$ are the same as or different from each other, and are each independently 0 or $NR_{16}$, and $R_{16}$ is a $C_1$ to $C_{12}$ alkyl or a $C_2$ to $C_{12}$ alkenyl, $R_{11}$ and $R_{12}$ or $R_{13}$ and $R_{14}$ may also combine with each other to form a ring (cyclic), and Re and Rf are a halogen group, and m and n are each an integer of 0 to 4.

According to an example, Rb of Chemical Formula 11 may be represented by the following structural formula.

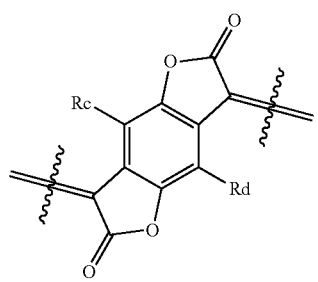

In the structural formula, Rc and Rd are the same as or different from each other, and are each independently H, CH$_3$, CF$_3$, F, or Cl.

According to an example, Chemical Formula 11 may be represented by the following structural formula.

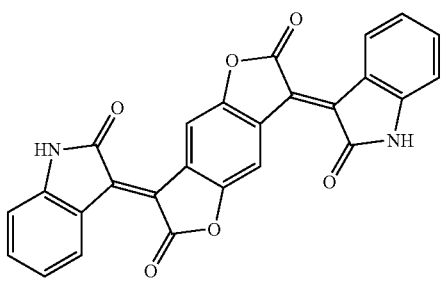 [SMILES: O=C1Nc2ccccc2/C1=C1\C(=O)Oc2cc3c(cc21)OC(=O)/C3=C1/C(=O)Nc2ccccc21]

Examples of a representative product of the compound of Chemical Formula 11 include Pigment IRGAPHOR Bk S0100CF manufactured by BASF Corp., and representative examples of Chemical Formula 12 include C.I. Pigment Black 31 and 32, and the like.

According to another exemplary embodiment of the present application, the colorant further includes one or more pigments which absorb light with at least a portion of wavelengths from 400 nm to 600 nm. In this case, the weight ratio of the black organic pigment and the pigment which absorbs light with at least a portion of wavelengths from 400 nm to 600 nm may be 100:0 to 90:10.

According to an exemplary embodiment, the pigment which absorbs light with at least a portion of wavelengths from 400 nm to 600 nm may include at least one of a yellow-based pigment, an orange-based pigment, a brown-based pigment, and a red-based pigment. Specifically, examples of the pigment which absorbs light with at least a portion of wavelengths from 400 nm to 600 nm include a yellow-based pigment such as C.I. Pigment yellow 138, C.I. Pigment yellow 139, C.I. Pigment yellow 150, C.I. Pigment yellow 151, C.I. Pigment yellow 83, C.I. Pigment yellow 93, and C.I. Pigment yellow 110, C.I. Pigment Red 123, C.I. Pigment Red 149, C.I. Pigment Red 178, C.I. Pigment Red 179, C.I. Pigment Red 224, C.I. Pigment Red 139, C.I. Pigment Red 143, C.I. Pigment Red 166, C.I. Pigment Red 242, C.I. Pigment Red 175, C.I. Pigment Red 176, C.I. Pigment Red 177, C.I. Pigment Red 185, C.I. Pigment Red 208, C.I. Pigment Red 254, C.I. Pigment Red 255, C.I. Pigment Red 264, C.I. Pigment Red 272, C.I. Pigment Orange 36, C.I. Pigment Orange 62, C.I. Pigment Orange 64, C.I. Pigment Orange 72, C.I. Pigment Orange 71, C.I. Pigment Orange 73, C.I. Pigment Brown 23, C.I. Pigment Brown 41, C.I. Pigment Brown 42, and the like.

According to another exemplary embodiment of the present application, the colorant may further include a high-resistance carbon black having a volume resistance of 10$^{11}$ Ω·cm or more based on a content of 50 wt % used in a paint film. The weight ratio of the black organic pigment and the high-resistance carbon black may be 99.5:0.5 to 90:10.

According to an example, the colorant may be used in an amount of 1 to 50 wt % based on the total weight of the resin composition.

According to still another exemplary embodiment of the present application, the photoinitiator is a material which serves to generate radicals by light, and it is preferred to use one compound or a mixture of two or more compounds selected from the group consisting of an acetophenone-based compound, a biimidazole-based compound, a triazine-based compound, and an oxime-based compound.

As the acetophenone-based compound which can be used as the photoinitiator, it is possible to use those selected from the group consisting of 2-hydroxy-2-methyl-1-phenylpropan-1-one, 1-(4-isopropylphenyl)-2-hydroxy-2-methylpropan-1-one, 4-(2-hydroxyethoxy)-phenyl-(2-hydroxy-2-propyl)ketone, 1-hydroxy cyclohexyl phenyl ketone, benzoin methyl ether, benzoin ethyl ether, benzoin isobutyl ether, benzoin butyl ether, 2,2-dimethoxy-2-phenyl acetophenone, 2-methyl-(4-methylthio)phenyl-2-morpholino-1-propan-1-one, 2-benzyl-2-dimethylamino-1-(4-morpholinophenyl)-butan-1-one, 2-(4-bromo-benzyl-2-dimethylamino-1-(4-morpholinophenyl)-butan-1-one, and 2-methyl-1-[4-(methylthio)phenyl]-2-morpholinopropan-1-one.

As the biimidazole-based compound, it is possible to use those selected from the group consisting of 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole, and 2,2'-bis(o-chlorophenyl)-4,4,5,5'-tetraphenyl-1,2'-biimidazole.

As the triazine-based compound, it is possible to use those selected from the group consisting of 3-{4-[2,4-bis(trichloromethyl)-s-triazin-6-yl]phenylthio}propionic acid, 1,1,1,3,3,3-hexafluoro isopropyl-3-{4-[2,4-bis(trichloromethyl)-s-triazin-6-yl]phenylthio}propionate, ethyl-2-{4-[2,4-bis(trichloromethyl)-s-triazin-6-yl]phenylthio}acetate, 2-epoxyethyl-2-{4-[2,4-bis(trichloromethyl)-s-triazin-6-yl]phenylthio}acetate, cyclohexyl-2-{4-[2,4-bis(trichloromethyl)-s-triazin-6-yl]phenylthio}acetate, benzyl-2-{4-[2,4-bis(trichloromethyl)-s-triazin-6-yl]phenylthio}acetate, 3-{ch- loro-4-[2,4-bis(trichloromethyl)-s-trizin-6-yl]phenylthio} propionic acid, 3-{4-[2,4-bis(trichloromethyl)-s-triazin-6-yl] phenylthio}propionamide, 2,4-bis(trichloromethyl)-6-p-methoxystyryl-s-triazine, 2,4-bis(trichlorome- thyl)-6-(1-p-dimethylaminophenyl)-1,3,-butadienyl-s-triazine, and 2-trichloromethyl-4-amino-6-p-methoxystyryl-s-triazine.

Examples of the oxime-based compound include 1,2-octadione-1-(4-phenylthio)phenyl-2-(o-benzoyloxime) (Ciba-Geigy, Co., Ltd., CGI124), ethanone-1-(9-ethyl)-6-(2-methylbenzoyl-3-yl)-1-(o-acetyloxime) (CGI 242), Oxime OX-03 (Ciba-Geigy, Co., Ltd.), NCI-831 (ADEKA Co., Ltd.), PI-102 (LG Chem. Co., Ltd.), PBG 304, PBG 305, and PBG 3057 (Tronly Co., Ltd.), and the like. It is preferred that the photoinitiator is included in an amount of 0.5 to 10 wt % based on the total weight of the resin composition. More preferably, the photoinitiator may be used in an amount of 10 to 300 parts by weight (based on the total amount of photoinitiator used) based on 100 parts by weight of the polyfunctional monomer having an ethylenically unsaturated double bond, and particularly, based on the total weight of the resin composition, the acetophenone-based compound may be used in an amount of 0.5 to 5 wt %, or a mixture of 0.01 to 3 wt % of the acetonphenone-based compound as the oxime-based initiator may also be used.

The photoinitiator may additionally include, as an auxiliary component, 0.01 to 5 wt % of a photocrosslinking sensitizer which accelerate the generation of radicals, or 0.01 to 5 wt % of a curing accelerator which accelerates curing, based on the total weight of the resin composition.

As the photocrosslinking sensitizer, it is possible to use a benzophenone-based compound such as benzophenone, 4,4-bis(dimethylamino)benzophenone, 4,4-bis(diethylamino) benzophenone, 2,4,6-trimethylaminobenzophenone, methyl-o-benzoylbenzoate, 3,3-dimethyl-4-methoxybenzophenone, and 3,3,4,4-tetra(t-butylperoxycarbonyl)benzophenone; a fluorenone-based compound such as 9-fluorenone, 2-chloro-9-fluorenone, and 2-methyl-9-fluorenone; a thioxanthone-based compound such as thioxanthone, 2,4-diethyl thioxanthone, 2-chloro thioxanthone, 1-chloro-4-propyloxy thioxanthone, isopropyl thioxanthone, and diisopropyl thioxanthone; a xanthone-based compound such as xanthone and 2-methylxanthone; an anthraquinone-based compound such as anthraquinone, 2-methyl anthraquinone, 2-ethyl anthraquinone, t-butyl anthraquinone, and 2,6-dichloro-9, 10-anthraquinone; an acridine-based compound such as 9-phenylacridine, 1,7-bis(9-acrydinyl)heptane, 1,5-bis(9-acrydinylpentane), and 1,3-bis(9-acrydinyl)propane; a dicarbonyl compound such as benzyl, 1,7,7-trimethyl-bicyclo[2, 2,1]heptan-2,3-dione, and 9,10-penanthrenequinone; a phosphine oxide-based compound such as 2,4,6-trimethylbenzoyl diphenylphosphine oxide and bis(2,6-dimethoxybenzoyl)-2,4,4-trimethylpentyl phosphine oxide; a benzoate-based compound such as methyl-4-(dimethylamino) benzoate, ethyl-4-(dimethylamino)benzoate, and 2-n-buthoxyethyl-4-(dimethylamino)benzoate; an amino synergist such as 2,5-bis(4-diethylaminobenzal)cyclopentanone, 2,6-bis(4-diethylaminobenzal)cyclohexanone, and 2,6-bis(4-diethylaminobenzal)-4-methyl-cyclopentanone; a coumarine-based compound such as 3,3-carbonylvinyl-7-(diethylamino)coumarine, 3-(2-benzothiazolyl)-7-(diethylamino)coumarine, 3-benzoyl-7-(diethylamino)coumarine, 3-benzoyl-7-methoxy-coumarine, and 10,10-carbonylbis[1, 1,7,7-tetramethyl-2,3,6,7-tetrahydro-1H,5H,11H—C1]-benzopyrano[6,7,8-ij]-quinolizin-11-one; a chalcone compound such as 4-diethylamino chalcone and 4-azidebenzalacetophenone; and 2-benzoylmethylene, or 3-methyl-b-naphthothiazoline, and the like.

Further, as the curing accelerator, it is possible to use 2-mercaptobenzoimidazole, 2-mercaptobenzothiazole, 2-mercaptobenzoxazole, 2,5-dimercapto-1,3,4-thiadiazole, 2-mercapto-4,6-dimethylaminopyridine, pentaerythritol-tetrakis(3-mercaptopropionate), pentaerythritol-tris(3-mercaptopropionate), pentaerythritol-tetrakis(2-mercaptoacetate), pentaerythritol-tris(2-mercaptoacetate), trimethylolpropane-tris(2-mercaptoacetate), or trimethylolpropane-tris(3-mercaptopropionate), and the like.

In yet another exemplary embodiment of the present application, as the solvent, it is possible to use propylene glycol monomethyl ether, ethylene glycol monomethyl ether acetate, propylene glycol monomethyl ether acetate, propylene glycol monoethyl ether acetate, diethylene glycol dimethyl ether, cyclohexanone, 2-heptanone, 3-heptanone, 2-hydroxyethyl propionate, 3-methyl-3-methoxybutyl propionate, ethyl-3-methoxypropionate, methyl-3-ethoxypropionate, ethyl-3-ethoxypropionate, butyl acetate, amyl formate, isoamyl acetate, isobutyl acetate, butyl propionate, isopropyl butyrate, ethyl butyrate, butyl butyrate, ethyl pyruvate, or γ-butyrol acetate, and the like, in consideration of solubility, pigment dispersibility, coatability, and the like. The solvents may be used either alone or in mixture of two or more thereof.

The resin composition according to the above-described exemplary embodiment may additionally include an additive as long as the object of the present invention is not adversely affected. For example, one or more additives selected from the group consisting of a dispersant, an adhesion promoter, an antioxidant, an ultraviolet absorber, a thermal polymerization inhibitor, and a leveling agent may be additionally used.

The dispersant may be used by a method of internally adding the dispersant to a pigment in a form in which the pigment is subjected to surface treatment in advance or by a method of externally adding the dispersant to the pigment. As the dispersant, a polymer-form, non-ionic, anionic, or cationic dispersant may be used. Non-limiting examples of the dispersant include polyalkylene glycol and esters thereof, polyoxyalkylene polyhydric alcohol, ester alkylene oxide addition products, alcohol alkylene oxide addition products, sulfonic acid esters, sulfonic acid salts, carboxylic acid esters, carboxylic acid salts, alkyl amide alkylene oxide addition products, or alkyl amine, and the like. The dispersants may be added either alone or in combination of two or more thereof.

Non-limiting examples of the adhesion promoter include vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltriethoxysilane, 3-glycidoxypropylmethyldimethoxysilane, 2-(3,4-ethoxycyclohexyl)ethyltrimethoxysilane, 3-chloropropylmethyldimethoxysilane, 3-chloropropyltrimethoxysilane, 3-methacryloxypropyltrimethoxysilane, or 3-mercaptopropyltrimethoxysilane, and the like.

Non-limiting examples of the antioxidant include 2,2-thiobis(4-methyl-6-t-butylphenol), or 2,6-g,t-butylphenol, and the like, and non-limiting examples of the ultraviolet absorber include 2-(3-t-butyl-5-methyl-2-hydroxyphenyl)-5-chloro-benzotriazole, or alkoxy benzophenone, and the like. Further, non-limiting examples of the thermal polymerization inhibitor include hydroquinone, p-methoxyphenol, di-t-butyl-p-cresol, pyrogallol, t-butylcatechol, benzoquinone, 4,4-thiobis(3-methyl-6-t-butylphenol), 2,2-methylenebis(4-methyl-6-t-butylphenol), or 2-mercaptoimidazole, and the like.

In addition, in the resin composition, one or more additives selected from the group consisting of the pigment mixture dispersion, a resin binder having functionality, a monomer, a radiation sensitive compound, and other additives may be further used.

The resin composition according to the above-described exemplary embodiments may be prepared by mixing the above-described components. According to an example, first, a pigment dispersion solution is prepared. The preparation of the pigment dispersion solution may be replaced by using a pigment commercially available in a dispersion solution state. A resin composition may be prepared by mixing an alkali soluble resin binder with the pigment dispersion solution, adding a polyfunctional monomer, a photoinitiator, and a solvent thereto, and stirring the resulting mixture.

Since the resin composition according to the above-described exemplary embodiments is a negative type, a material having high ultraviolet sensitivity and no pattern residue may be used. According to an example, the resin composition may have a volume resistance of $10^{12}$ Ω·cm or more and a permittivity of 3 to 6 when a paint film having a thickness of 2 μm is formed. According to another example, when the paint film having a thickness of 2 μm is formed, the light transmittance at 380 nm to 600 nm may be less than 1%, and the optical density (OD) may be 1/μm or more. According to still another example, the resin composition has a tapered angle of 15° to 35° when a paint film having a thickness of 2 μm is formed. By forming a gentle tapered angle as described above, the possibility that a short circuit occurs in an electrode becomes very low even though the electrode is formed thereon.

Another exemplary embodiment of the present application provides a display apparatus including a black bank formed by using the above-described negative type photosensitive resin composition. FIG. 1 is a schematic view of a display apparatus including a transparent bank in the related art, and FIG. 2 is a schematic view of a display apparatus including a black bank according to the present invention.

An example of a method of forming the black bank is as follows.

A film may be formed by applying the above-described resin composition on a surface of a substrate, and removing the solvent by pre-bake. As the application method, a method such as a spray method, a roll coating method, a spin coating method, a bar coating method, and a slit coating method may be used. The conditions of the pre-bake vary depending on the blending component and ratio of the composition, but the pre-bake may be usually performed at 70 to 150° C. for 0.5 to 30 minutes.

Next, a pattern is formed by irradiating a radiation such as ultraviolet ray onto the pre-baked application film through a predetermined pattern mask, and developing the film by using an aqueous alkaline solution to remove an unnecessary portion. As the development method, a dipping method, a shower method, and the like may be applied without limitation. The development time is typically 30 to 180 seconds. As an aqueous alkaline solution as the developing solution, it is possible to use an aqueous solution of: inorganic alkalis such as sodium hydroxide, potassium hydroxide, sodium silicate, sodium metasilicate, and ammonia; primary amines such as ethyl amine and N-propylamine; secondary amines such as diethylamine and di-n-butylamine; tertiary amines such as trimethylamine, methyldiethylamine, and dimethylethylamine; tertiary alcohol amines such as dimethylethanolamine, methyldiethanolamine, and triethanolamine; cyclic tertiary amines such as pyrrole, piperidine, n-methylpiperidine, n-methylpyrrolidine, 1,8-diazabicyclo[5.4.0]-7-undecene, and 1,5-diazabicyclo[4.3.0]-5-nonene; aromatic tertiary amines such as pyridine, collidine, lutidine and quinoline; quaternary ammonium salts such as tetramethyl ammonium hydroxide and tetraethyl ammonium hydroxide, and the like.

After the development, the developed film is washed with running water for 30 to 90 seconds and dried with air or nitrogen to form a pattern. A completed black bank may be obtained by post-baking the pattern using a heating apparatus such as a hot plate and an oven. In this case, as the conditions of the post-bake, it is preferred to heat the pattern at 150 to 230° C. for approximately 10 to 90 minutes.

The completed black bank has a volume resistance of $10^{12}$ Ω·cm or more, a permittivity of 3 to 6, and an optical density (OD) of 1 to 2/µm.

The preparation method of a display apparatus including an organic light emitting device according to an exemplary embodiment is not particularly limited, but for example, the display apparatus may be prepared as follows. A transparent electrode such as indium tin oxide (ITO) is deposited on a transparent substrate such as glass by sputtering, is subjected to a process, such as PR application, exposure, development, etching, and PR removal, to form a patterned transparent electrode, and then a black bank is formed by using the above-described resin composition. For example, the above-described resin composition is coated onto a substrate, on which an electrode is formed, to form a paint film, the substrate is exposed by using a photomask and the like and a radiation including ultraviolet ray, then the exposed substrate may be developed, washed, and then dried to pattern the substrate. Subsequently, a partition for dividing each pixel may be formed on the formed black bank.

And then, an organic thin film is deposited in a single layer or in multiple layers. The organic thin film includes a light emitting layer, and may further include a layer for transporting or blocking charges, for example, an electron injection layer, an electron transport layer, a hole blocking layer, a hole transport layer, a hole injection layer and/or an electron blocking layer, if necessary. And then, a metal electrode layer is deposited thereon. Next, a display apparatus including an organic light emitting device may be prepared by encapsulating (sealing) an SUS canister having a hollow structure and the substrate with an encapsulation material (sealant) such as an epoxy resin, and then assembling the encapsulated product into a module.

As illustrated in FIG. 3, the display apparatus includes a color pattern (a), an overcoat layer (b) provided on the color pattern, and a black bank provided on the overcoat layer, and the black bank may have a thickness difference of 0.5 to 2 µm. The display apparatus may further include a white pixel (d) in which a color pattern layer is not present. Even in this case, the uniformity of the thickness of the black bank may be maintained. Specifically, the thickness (f1) of a black bank on a stacking part and an overcoat layer of pixels of the color filter may be 0.5 to 2 µm, the thickness (f2) of a black bank on a flat part and the overcoat layer of a pixel of the color filter and the thickness (f3) of a black bank formed on a white pixel may be each 1 to 3 µm, and f3−f1 may be 0.5 to 2 µm.

Hereinafter, preferred Examples for helping the understanding of the present invention will be suggested. However, the following Examples are only for exemplifying the present invention, and the scope of the present invention is not limited to the following Examples.

EXAMPLE

The following components were mixed in amounts of parts by weight in the following Table 1 based on 100 parts by weight of photoinitiator 1 to prepare a resin composition.

Black pigment dispersion solution: 16 wt % of organic pigment IRGAPHOR Bk S0100CF manufactured by Tokushiki Co., Ltd., dispersion solvent PGMEA Binder 1: an alkali soluble binder resin composed of a bisphenol fluorene epoxy acrylate to which acrylic acid was added/1,3-cyclohexyldiisocyanate at a molar ratio of 65/35 and having a weight average molecular weight of 4,000 and an acid value of 80 KOH mg/g Binder 2: a binder resin composed of benzylmethacrylate/N-phenylmaleimide/styrene/methacrylic acid=55/9/11/25 (molar ratio) and having a number average molecular weight of 13,000 and an acid value of 100 KOH mg/g Polyfunctional monomer: dipentaerythritol hexaacrylate (DPHA)

Photoinitiator 1: 1-369 manufactured by BASF Corp.

Photoinitiator 2: OX-03 manufactured by BASF Corp.

Adhesion promoter: KBM 503 manufactured by Shin-Etsu Chemical Co., Ltd.

Surfactant: DIC_F560

PGMEA: propylene glycol methyl ether acetate

MBA: 3-methoxybutyl acetate

MBDG: diethylene glycol methyl butyl ether

TABLE 1

| Component | Example 1 | Example 2 | Example 3 | Example 4 | Example 5 | Example 6 | Example 7 |
|---|---|---|---|---|---|---|---|
| Black pigment dispersion solution | 2700 | 2700 | 2700 | 2700 | 2700 | 2700 | 2700 |
| Binder 1 | 240 | 240 | 240 | 240 | 240 | 240 | 240 |
| Binder 2 | 50 | 50 | 50 | 50 | 50 | 50 | 50 |
| Monomer | 150 | 150 | 150 | 150 | 150 | 150 | 150 |
| Photoinitiator 1 | 100 | 100 | 100 | 100 | 100 | 100 | 100 |
| Photoinitiator 2 | 10 | 10 | 10 | 10 | 10 | 10 | 10 |
| Adhesion promoter | 20 | 20 | 20 | 20 | 20 | 20 | 20 |
| Surfactant | 0.6 | 0.6 | 2.5 | 2.5 | 0.6 | 0.2 | 4 |
| Chemical Formula 3 (X: NH, $R_1$: $CH_3$, $R_3$: $(CH_2)_2$, $R_2$: $CH_2CH(OH)CH_2OH$, and n = 4) | 4 | 15 | 4 | 2 | 25 | 15 | 4 |
| PGMEA | 1260 | 1260 | 1260 | 1260 | 1260 | 1260 | 1260 |
| MBA | 1570 | 1570 | 1570 | 1570 | 1570 | 1570 | 1570 |
| MBDG | 260 | 260 | 260 | 260 | 260 | 260 | 260 |

The resin composition prepared above was applied onto a substrate (370 mm×470 cm) coated with a color filter (about 2 μm) and an overcoat (about 2 μm). In this case, a slit coater was used, and the coating conditions were as follows.

Coating speed 250 mm/sec
Coating gap 100 μm
Discharge amount 2,215 μL/sec

Subsequently, the substrate was dried until pressure reached 65 Pa by a low pressure drying process (VCD, vacuum dry), and then a pre-bake was performed at 100° C. on a digital hot plate having a contact & proximity mode for 100 seconds.

Subsequently, as the UV exposure step, light, from which light with a wavelength of 330 nm or less was removed by using a short-wavelength cutting filter, was used, and the substrate was exposed by using 80 mJ/cm² UV using a black bank mask having a 50 μm gap.

Subsequently, the development was performed under a pressure of 1.5 kgf/cm² at 25° C. for 60 seconds by using 0.043% KOH, and a washing step was performed by using DI water. Subsequently, post-bake was performed at 230° C. in a convection oven for 20 minutes.

The flow characteristics, paint film characteristics, and processability were evaluated and are shown in the following Table 2.

Surface defect: When the coated paint film is observed by the unaided eye or by an optical microscope, the surface defect is marked as 0 in the absence of surface unevenness or defect and X in the observation of unevenness or defect Process margin: When a development margin range where an optimal pattern is obtained in the development process is 15 seconds or more, 10 seconds or more and less than 15 seconds, and less than 10 seconds, the process margin is marked as ○, Δ, and X, respectively According to Table 2, Examples 4 and 7 exhibited excellent effects in the surface defect and process margin, but in terms of the f1 thickness, Examples 1 to 3 exhibited much better effects as compared to Examples 4 and 7. Further, Examples 1 to 3 exhibited excellent effects in terms of surface defect or process margin as compared to Examples 5 and 6.

EXPLANATION OF REFERENCE NUMERALS AND SYMBOLS a: Color filter
b: Overcoat layer
b1: Thickness of overcoat layer on flat part of pixel of color filter

TABLE 2

| Component | Thickness (f1) (Thickness of a black bank on a color filter overlapped part, μm) | Thickness (f2) (Thickness of a black bank on a color filter flat part, μm) | Thickness (f3) (Thickness of a black bank on a white pixel part, μm) | Surface defect (defect) | Process margin |
|---|---|---|---|---|---|
| Example 1 | 1.35 | 1.94 | 2.05 | ○ | ○ |
| Example 2 | 1.37 | 1.90 | 2.05 | ○ | ○ |
| Example 3 | 1.27 | 1.81 | 2.16 | ○ | ○ |
| Example 4 | 0.45 | 1.23 | 1.55 | ○ | ○ |
| Example 5 | 1.37 | 2.02 | 2.43 | ○ | Δ |
| Example 6 | 1.41 | 1.74 | 2.06 | X | ○ |
| Example 7 | 0.39 | 1.02 | 1.45 | ○ | ○ | b2: Thickness of overcoat layer of stacking part of pixels of color filter
c: Metal electrode
d: White pixel
e: Metal line
f1: Thickness of black bank on stacking part and overcoat layer of pixels of color filter
f2: Thickness of black bank on flat part and overcoat layer of pixel of color filter
f3: Thickness of black bank formed on white pixel

The invention claimed is:

1. A negative type photosensitive resin composition comprising:
a compound of the following Chemical Formula 1;

[Chemical Formula 1]

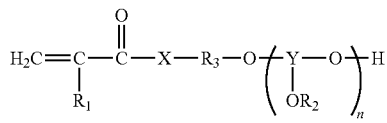

an alkali soluble resin binder;
a polyfunctional monomer;
a colorant;
a photoinitiator; and
a solvent, wherein
in Chemical Formula 1,
$R_1$ is hydrogen; or a linear or branched alkyl group,
$R_2$ is $CHR_6CH(OH)CHR_7(OH)$, and wherein, $R_6$ and $R_7$ are hydrogen; or a linear or branched alkyl group,
X is —NH— or —O—,
$R_3$ is a linear or branched alkylene; or aralkylene, and
Y is a linear or branched alkylene, and n is an integer of 1 to 10.

2. The negative type photosensitive resin composition of claim 1, wherein Chemical Formula 1 is represented by the following Chemical Formula 2:

[Chemical Formula 2]

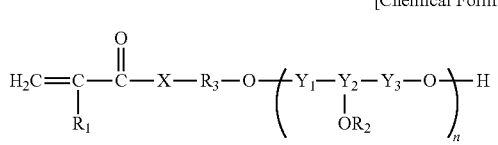

in Chemical Formula 2,
$R_1$, $R_2$, $R_3$, X, and n are the same as those defined in Chemical Formula 1,
$Y_1$ and $Y_3$ are a direct bond; or a linear or branched alkylene, and
$Y_2$ is a linear or branched alkylene.

3. The negative type photosensitive resin composition of claim 1, wherein Chemical Formula 1 is represented by the following Chemical Formula 3:

[Chemical Formula 3]

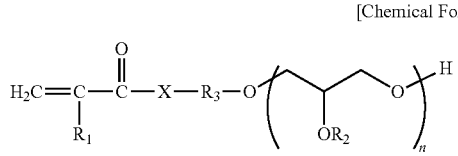

in Chemical Formula 3, the definitions of the substituents are the same as those in Chemical Formula 1.

4. The negative type photosensitive resin composition of claim 1, wherein Chemical Formula 1 is represented by the following Chemical Formula 4 or 5:

[Chemical Formula 4]

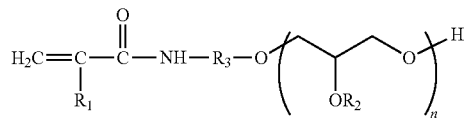

[Chemical Formula 5]

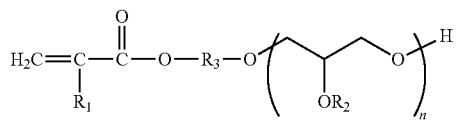

in Chemical Formulae 4 and 5, the definitions of the substituents are the same as those in Chemical Formula 1.

5. The negative type photosensitive resin composition of claim 1, wherein the compound of Chemical Formula 1 is comprised in an amount of 100 ppm to 3,000 ppm based on the entire resin composition.

6. The negative type photosensitive resin composition of claim 1, further comprising:
50 ppm to 450 ppm of a surfactant.

7. The negative type photosensitive resin composition of claim 6, wherein the surfactant is a fluorine-based or silicone-based surfactant.

8. The negative type photosensitive resin composition of claim 1, wherein the colorant comprises a black organic pigment.

9. The negative type photosensitive resin composition of claim 8, wherein the colorant further comprises one or more pigments which absorb light with at least a portion of wavelengths from 400 nm to 600 nm.

10. The negative type photosensitive resin composition of claim 9, wherein a weight ratio of the black organic pigment and the pigment which absorbs light with at least a portion of wavelengths from 400 nm to 600 nm is 100:0 to 90:10.

11. The negative type photosensitive resin composition of claim 8, wherein the colorant further comprises a high-resistance carbon black having a volume resistance of $10^{11}$ $\Omega \cdot cm$ or more based on a content of 50 wt % used in a paint film.

12. The negative type photosensitive resin composition of claim 11, wherein a weight ratio of the black organic pigment and the high-resistance carbon black is 99.5:0.5 to 90:10.

13. The negative type photosensitive resin composition of claim 1, wherein the negative type photosensitive resin composition has a volume resistance of $10^{12}$ $\Omega \cdot cm$ or more, a permittivity of 3 to 6, a light transmittance of less than 1% at 380 nm to 600 nm, an optical density (OD) of 1/μm or more, and a tapered angle of 15° to 35° when a paint film having a thickness of 2 μm is formed.

14. The negative type photosensitive resin composition of claim 1, wherein the alkali soluble resin binder, the polyfunctional monomer, and the photoinitiator are each comprised in an amount of 0.5 to 10 wt % based on the entire resin composition, and the colorant is comprised in an amount of 1 to 50 wt % based on the entire resin composition.

15. A display apparatus comprising a black bank formed from a method comprising:
   applying the negative type photosensitive resin composition of claim 1 on a surface of a substrate,
   removing the solvent of the negative type photosensitive resin composition by pre-bake to obtain a pre-baked film;
   forming a pattern in the pre-baked film by irradiating through a predetermined pattern mask;
   developing the irradiated film using an aqueous alkaline solution;
   washing the developed film with a solution comprising water; and drying the film.

* * * * *